(12) United States Patent
Brugnara et al.

(10) Patent No.: US 11,739,426 B2
(45) Date of Patent: Aug. 29, 2023

(54) COMPONENT, IN PARTICULAR FOR A VALVE TRAIN SYSTEM, AND METHOD FOR PRODUCING A COMPONENT OF THIS TYPE

(71) Applicant: Schaeffler Technologies AG & Co. KG, Herzogenaurach (DE)

(72) Inventors: Ricardo Henrique Brugnara, Hessdorf (DE); Nazlim Bagcivan, Nuremberg (DE); Edgar Schulz, Langensendelbach (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 0 days.

(21) Appl. No.: 17/283,187

(22) PCT Filed: Sep. 2, 2019

(86) PCT No.: PCT/DE2019/100786
§ 371 (c)(1),
(2) Date: Apr. 6, 2021

(87) PCT Pub. No.: WO2020/078505
PCT Pub. Date: Apr. 23, 2020

(65) Prior Publication Data
US 2021/0348279 A1 Nov. 11, 2021

(30) Foreign Application Priority Data
Oct. 16, 2018 (DE) .................. 102018125631.0

(51) Int. Cl.
*C23C 28/00* (2006.01)
*C23C 14/02* (2006.01)
(Continued)

(52) U.S. Cl.
CPC .......... *C23C 28/343* (2013.01); *C23C 14/025* (2013.01); *C23C 14/0605* (2013.01);
(Continued)

(58) Field of Classification Search
CPC . C23C 14/025; C23C 14/0605; C23C 28/323; C23C 28/343
(Continued)

(56) References Cited

U.S. PATENT DOCUMENTS 6,331,332 B1* 12/2001 Wang .................... C23C 14/325
427/249.7
7,273,655 B2* 9/2007 Miyake .................. F01L 1/205
427/249.7
(Continued)

FOREIGN PATENT DOCUMENTS

AT 14701 4/2016
CN 104911566 A 9/2015
(Continued)

*Primary Examiner* — Seth Dumbris
(74) *Attorney, Agent, or Firm* — Volpe Koenig

(57) ABSTRACT

A component (100), in particular for a valve train system, having a substrate (3) and a layer system (1) applied at least in parts to the substrate (3), wherein the layer system (1) includes a friction-reducing and wear-reducing protective layer (2) for forming a component surface, wherein the protective layer (2) has at least one first sub-layer (4, 4a) made of doped tetrahedral amorphous carbon, which includes $sp^3$-hybridized carbon having a mole fraction of at least 50%, wherein the first sub-layer (4, 4a) contains oxygen in a concentration in the range from 0.1 at % to 3.0 at % and hydrogen in a concentration in the range from 0.1 at % to 15 at %, and wherein the first sub-layer (4, 4a) has one or more of the following dopants in a concentration in the range from 0.03 at % to 15 at %: chromium, molybdenum, tungsten, silicon, copper, niobium, zirconium, vana-
(Continued)

dium, nickel, iron, silver, hafnium, fluorine, boron and nitrogen. A method for producing such a component (100) is also provided.

16 Claims, 3 Drawing Sheets

(51) Int. Cl.
    *C23C 14/06*     (2006.01)
    *C23C 14/35*     (2006.01)
(52) U.S. Cl.
    CPC ............ *C23C 28/323* (2013.01); *C23C 28/42* (2013.01); *C23C 28/44* (2013.01); *C23C 14/35* (2013.01); *Y10T 428/30* (2015.01)
(58) Field of Classification Search
    USPC ......................................................... 428/408
    See application file for complete search history.

(56) References Cited

U.S. PATENT DOCUMENTS

| | | | |
|---|---|---|---|
| 2006/0046060 A1 | 3/2006 | Rorig et al. | |
| 2006/0049035 A1 | 3/2006 | Hosenfeldt et al. | |
| 2007/0224349 A1 | 9/2007 | Hosenfeldt et al. | |
| 2008/0044646 A1 | 2/2008 | Rorig et al. | |
| 2008/0220257 A1* | 9/2008 | Dekempeneer | C23C 28/343 428/408 |
| 2012/0164454 A1 | 6/2012 | Sung | |
| 2012/0248711 A1* | 10/2012 | Iwashita | C23C 14/16 277/440 |
| 2015/0292622 A1* | 10/2015 | Kennedy | C23C 14/0605 277/442 |
| 2015/0368579 A1 | 12/2015 | Takai | |
| 2017/0121810 A1 | 5/2017 | Araujo et al. | |
| 2018/0105421 A1* | 4/2018 | Polcik | H01J 37/3491 |
| 2018/0216593 A1 | 8/2018 | Lukitsch et al. | |

FOREIGN PATENT DOCUMENTS

| | | | |
|---|---|---|---|
| CN | 106103788 A | 11/2016 | |
| CN | 106255776 A | 12/2016 | |
| CN | 108374741 A | 8/2018 | |
| DE | 102004041234 | 3/2006 | |
| DE | 102004041235 | 3/2006 | |
| DE | 102004043550 | 3/2006 | |
| DE | 102010062114 A1 | 5/2012 | |
| DE | 102015108608 A1 | 12/2015 | |
| DE | 102015208644 A1 | 11/2016 | |
| DE | 112015001603 | 12/2016 | |
| DE | 102016202149 A1 | 8/2017 | |
| DE | 102018102073 | 8/2018 | |
| EP | 2628817 A1 | 8/2013 | |
| FR | 3008905 A1 | 1/2015 | |
| WO | 2009062877 A2 | 5/2009 | |
| WO | WO-2009062877 A2 * | 5/2009 | ......... C23C 14/0605 |
| WO | 2016171247 A1 | 10/2016 | |
| WO | 2017148582 | 9/2017 | |

* cited by examiner

COMPONENT, IN PARTICULAR FOR A VALVE TRAIN SYSTEM, AND METHOD FOR PRODUCING A COMPONENT OF THIS TYPE

CROSS-REFERENCE TO RELATED APPLICATIONS

This application is the U.S. National Phase of PCT Appln. No. PCT/DE2019/100786, filed Sep. 2, 2019, which claims priority to DE 102018125631.0, filed Oct. 16, 2018, the entire disclosures of which are incorporated by reference herein.

TECHNICAL FIELD

The disclosure relates to a component, in particular for a valve train system, comprising a substrate and a layer system applied at least in parts to the substrate, wherein the layer system comprises a friction-reducing and wear-reducing protective layer for forming a component surface. The disclosure also relates to a method for producing such a component.

BACKGROUND

Coatings for tribologically stressed surfaces are known from the prior art in a variety of embodiments. A field of application of considerable technological importance is the reduction of friction and wear in internal combustion engines. The high dynamic load on the components involved in power transmission and their surfaces sliding against one another require extremely high-performance coatings of high hardness and durability. Amorphous carbon layers have proven to be a particularly advantageous class of layer systems in this regard. In particular, so-called diamond-like carbon (DLC) layers are successfully used in the coating of parts of the crank drive, the valve control or the fuel injection system in diesel engines.

Compared to graphite, which is made up of crystalline layers of $sp^2$-hybridized carbon atoms and diamond, a crystal of tetrahedrally coordinated $sp^3$-hybridized carbon, amorphous carbon has a mixture of $sp^2$-hybridized and $sp^3$-hybridized carbon atoms, wherein some of the carbon can be bonded to other elements, in particular with hydrogen. With regard to the mechanical properties, the amorphous carbon phases can be viewed as an amorphous network of carbon atoms with a mixture of three different bond types: the bonds between two $sp^2$-hybridized carbon atoms ("graphite-like" bonds), bonds between $sp^3$-hybridized carbon atoms ("diamond-like" bonds) and carbon-hydrogen bonds. If there is a significant proportion of $sp^3$-hybridized carbon, the associated carbon layers are referred to as "diamond-type", wherein the designation "diamond-type carbon" (also "diamond-like carbon") is used as a collective term for a wide range of different carbon coatings (for classification and nomenclature, see VDI-Richtlinie 2840 "Kohlenstoffschichten—Grundlagen, Schichttypen and Eigenschaften"/[VDI guideline 2840 "Carbon layers—basics, layer types and properties"], June 2012). The diamond-type character, in particular the high hardness and the high modulus of elasticity, of these layers results from the proportion of $sp^3$ carbon-carbon bonds. There is a specific form of DLC in the case of a high proportion of $sp^3$-hybridized carbon, which is referred to as tetrahedral amorphous carbon. In the case of coatings, a distinction is made between tetrahedral, hydrogen-free amorphous carbon layers (abbreviated to ta-C) and tetrahedral, hydrogen-containing amorphous carbon layers (ta-C: H) (see the above-mentioned VDI guideline 2840).

The use of such coatings on engine elements such as injection nozzles, bucket tappets or piston pins give the components excellent friction properties, low adhesion, high surface hardness and offer increased protection against abrasive wear. Compared to diamond layers, the growth of which requires very high temperatures, amorphous carbon layers also have the advantage that they can be produced at lower temperatures and therefore more economically. In contrast, the disadvantages of amorphous carbon layers include low mechanical toughness and high residual compressive stresses. The latter in particular constitute, for example, a limiting factor for the layer thickness and also make it difficult to apply amorphous carbon layers in a stable manner to curved surfaces.

A wear-resistant coating made of hydrogen-free tetrahedral amorphous carbon is known from DE 10 2004 041 235 A1. WO 2017/148582 describes a coating with a hydrogen-free amorphous carbon layer and an adhesive layer made of zirconium. The document DE 10 2004 043 550 A1 describes a coating with a hydrogen-free, tetrahedral amorphous carbon-containing functional layer, and the utility model AT 14701 U1 describes a coating source or target (donor material) that consists of doped carbon.

SUMMARY

Against this background, the object arises of providing a component which has a layer system with a low coefficient of friction, high wear resistance and low internal stress and is suitable for coating curved surfaces, in particular engine components.

The object is achieved by a component comprising a substrate and a layer system applied least in parts to the substrate, wherein the layer system comprises a friction-reducing and wear-reducing protective layer for forming a component surface, wherein the protective layer has at least one first sub-layer made of doped tetrahedral amorphous carbon comprising $sp^3$-hybridized carbon having a mole fraction of at least 50%, wherein the first sub-layer contains oxygen in a concentration in the range from 0.1 at % to 3.0 at % and hydrogen in a concentration in the range from 0.1 at % to 15 at %, and wherein the first sub-layer has one or more of the following dopants in a concentration in the range from 0.03 at % to 15 at %: chromium, molybdenum, tungsten, silicon, copper, niobium, zirconium, vanadium, nickel, iron, silver, hafnium, fluorine, boron and nitrogen.

For the production of the first sub-layer from doped tetrahedral amorphous carbon, it is necessary to produce a high proportion of $sp^3$-hybridized carbon atoms. The electron transfer required for the hybridization is stimulated by the introduction of energy, wherein this energy is supplied to the carbon through interaction with high-energy particles which are supplied, for example, through arc evaporation or sputter deposition, with ion-assisted coating processes or plasma-based processes. However, the action of these high-energy particles simultaneously leads to distortions of the structure of the carbon network and generates high mechanical residual compressive stresses, which are in particular a limiting factor for the layer thickness. In addition, the adhesion of the mechanically stressed layer to a substrate is reduced since the stresses tend to deform the layer so that the layer can become detached or torn under tribological load. The application of the layer to curved component surfaces is made more difficult by the fact that a predetermined deformation is imposed on the layer due to the geometric shape of the substrate. By incorporating hydrogen and oxygen in the tetrahedral amorphous carbon, a substantial reduction in the residual compressive stresses can be achieved and the elasticity of a first sub-layer can be increased so that a layer system can be produced that can also be used on curved surfaces with a sufficient layer thickness and good adhesive strength.

The incorporation of hydrogen and oxygen also creates a first sub-layer which, when it comes into sliding contact with steel, has a coefficient of friction that is only negligibly reduced by moisture. Furthermore, a tetrahedral amorphous carbon layer formed with hydrogen and oxygen has increased thermal stability.

In particular, the additional doping of a first sub-layer with metals has proven to be a further effective measure for reducing the residual compressive stresses. In addition to reducing the residual compressive stresses, other properties of a first sub-layer and thus of the protective layer can be improved in a targeted manner by suitably selected doping elements. In particular, doping with fluorine, silicon and/or copper leads to a considerable improvement in the tribological properties of the tetrahedral amorphous carbon layers. Doping with silicon creates a protective layer which, when it comes into sliding contact with steel, has a coefficient of friction that is only negligibly reduced by moisture. Furthermore, tetrahedral amorphous carbon layers mixed with silicon have increased thermal stability. Doping with boron in connection with fluorine creates protective layers that show a combination of high hardness and hydrophobic properties and the addition of tungsten can lead to a significant reduction in friction. Another possible dopant is nitrogen in order to give the protective layer a lower coefficient of friction and a longer service life.

According to the disclosure, a first sub-layer contains the dopant(s) in a concentration in the range from 0.03 at % to 15 at %. The respective concentration is preferably in the range from 0.2 at % to 10 at % and particularly preferably in the range from 0.2 at % to 5 at %.

According to a further advantageous embodiment of the disclosure, the layer system has an adhesive layer, wherein the adhesive layer is arranged between the substrate and the protective layer, and wherein the adhesive layer has chromium and/or titanium and/or tungsten and/or zirconium and/or molybdenum and/or chromium nitride and/or titanium nitride and/or tungsten nitride and/or molybdenum nitride and/or zirconium nitride. To prevent detachment of the protective layer due to the residual compressive stresses of the tetrahedral amorphous carbon layer, the adhesion to a substrate can be improved with an adhesive layer selected in this way between the substrate and the protective layer. By applying an adhesive layer made of the aforementioned materials, the adhesive strength of the protective layer on the substrate can be significantly improved and thus exploited for use in components subject to tribological load.

A metallic adhesive layer, preferably made of titanium or chromium, can in particular significantly improve the adhesion to steel.

According to a further advantageous embodiment of the disclosure, the adhesive layer has a layer thickness in the range from 0.001 µm to 2.0 µm. The layer thickness is preferably in the range from 0.001 µm to 1.0 µm, particularly preferably in the range from 0.001 µm to 0.5 µm.

According to a further advantageous embodiment of the disclosure, the layer system has an intermediate layer, wherein the intermediate layer is arranged between the adhesive layer and the protective layer and has at least one carbide of a metal or transition metal and/or a carbonitride of a metal or transition metal and/or a non-metal.

A layer thickness of the intermediate layer is preferably in the range from 0.001 µm to 1.0 µm. In particular, the layer thickness of the intermediate layer is in the range from 0.001 µm to 0.5 µm, particularly preferably in the range from 0.001 µm to 0.05 µm. The intermediate layer can advantageously improve the adhesion between the protective layer and the adhesive layer. The intermediate layer can be deposited in a separate growth step or, for example, can be produced by carbide formation at the interface between the adhesive layer and the carbon layer in that carbon is implanted into the free surface of the adhesive layer.

According to a further advantageous embodiment of the disclosure, the protective layer consists of a single first sub-layer made of doped tetrahedral amorphous carbon. In this embodiment, the first sub-layer made of doped tetrahedral amorphous carbon is applied directly to a substrate and the layer system has no additional adhesive or intermediate layers. In this way, a particularly simple process control can advantageously be implemented without separate growth steps for different layers being necessary for the production of the protective layer.

According to a further advantageous embodiment of the disclosure, the protective layer has one or more first sub-layers made of doped tetrahedral amorphous carbon and one or more second sub-layers made of undoped tetrahedral amorphous carbon, wherein the first and second sub-layers alternate with one another. Due to the structure of alternately doped first sub-layers and undoped second sub-layers, the mechanical properties of the protective layer can be positively influenced in a targeted manner by a few experiments. In such a layered structure, for example, the propagation of material cracks is suppressed and the toughness of the protective layer is improved. The properties of the multi-layer structure can be further influenced by the degree of doping and the number and thickness of the first and second sub-layers.

According to a further advantageous embodiment of the disclosure, the protective layer has a hardness that is greater than 40 GPa. The specification of the hardness relates to a measurement using nanoindentation in accordance with DIN EN ISO 14577-4 (April 2017).

The component is in particular a sliding bearing component or a roller bearing component or a component of a finger follower or a rocker arm or a pump tappet or a roller tappet. In particular, the layer system is arranged on the component in a rolling contact and/or an anti-friction contact and/or a sliding contact to an adjacent contact component.

In particular, the component is a rolling element, in particular a cam roller, for example a cam follower, wherein the layer system is formed on a running surface of the rolling element and/or on one or more side surfaces of the rolling element. Rolling elements of this type are used in the valve train of internal combustion engines, for example as part of a roller finger follower. In internal combustion engines, the finger follower is used as a transmission element between the cam and the push rod. In the case of roller finger followers, the cam is picked up via cam rollers or cam followers. By applying the layer system according to the disclosure to the surface, wear phenomena due to the tribological loading of the roller surface can advantageously be reduced and the friction losses reduced. However, the component can advantageously also be an outer ring, an inner ring or an anti-friction body of an anti-friction bearing or an outer ring or inner ring of a sliding bearing.

The disclosure also relates to a method for producing the component according to the disclosure, wherein at least one first sub-layer made of doped tetrahedral amorphous carbon is applied in that the first sub-layer is applied by physical vapor deposition by means of arc evaporation, in particular an arc process, and/or by high-power impulse magnetron sputtering (high-power impulse magnetron sputtering, HiPIMS, or high-power pulsed magnetron sputtering, HPPMS), wherein the at least one dopant is introduced into the first sub-layer via a gas phase and/or a target material (donor material) made of doped carbon is used and/or the at least one dopant is incorporated into the protective layer by co-sputtering.

BRIEF DESCRIPTION OF THE DRAWINGS

Further details and advantages will be explained below with reference to the exemplary embodiment shown in the drawings. In the figures.

DETAILED DESCRIPTION

Figure 1A:
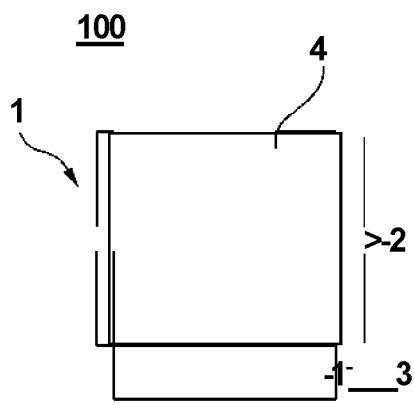
FIG. 1A shows an exemplary embodiment of a component according to the disclosure with a layer system on a substrate in a schematic representation.

In the exemplary embodiment shown in FIG. 1A of a component 100 according to the disclosure having a layer system 1, this consists of the protective layer 2, which is formed from a single homogeneous first sub-layer 4 of doped tetrahedral amorphous carbon, which is directly applied to a substrate 3.

Figure 1B:
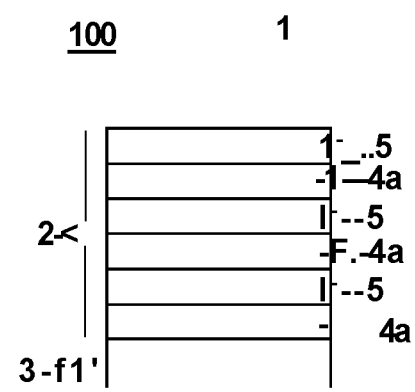
FIG. 1B shows an exemplary embodiment of a component according to the disclosure with a layer system on a substrate in a schematic representation.

In the exemplary embodiment shown in FIG. 1B, the component 100 comprises a protective layer 2, which is formed from a sequence of a plurality of first sub-layers 4a and second sub-layers 5, wherein a first sub-layer 4a made of a doped tetrahedral amorphous carbon is first applied directly to the substrate 3, on which in turn a second sub-layer 5 made of an undoped tetrahedral amorphous carbon is arranged. The alternation of doped first sub-layers 4a and undoped second sub-layers 5 continues up to the top second sub-layer 5.

Figure 2A:
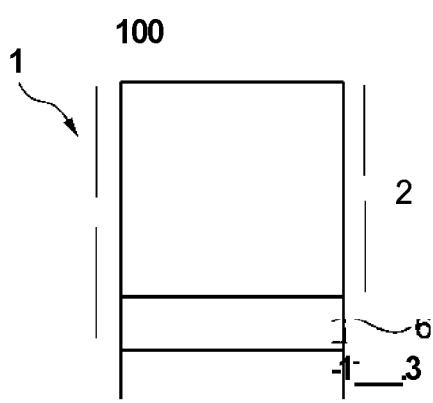
FIG. 2A shows an exemplary embodiment of a component according to the disclosure with a layer system comprising an adhesive layer on a substrate in a schematic representation.
Figure 2B:
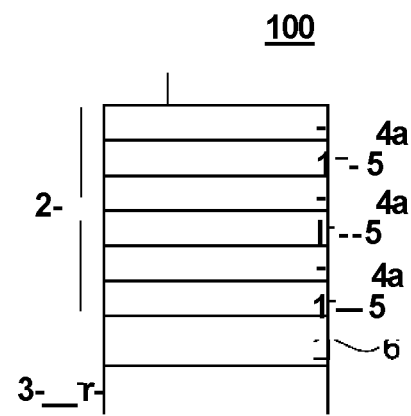
FIG. 2B shows an exemplary embodiment of a component according to the disclosure with a layer system comprising an adhesive layer on a substrate in a schematic representation.
Figure 3A:
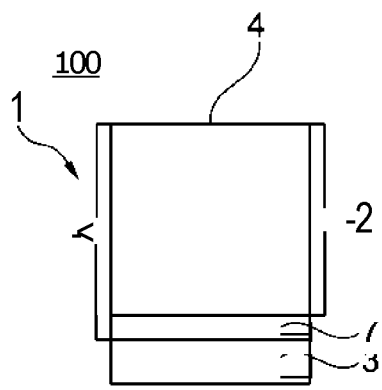
FIG. 3A shows an exemplary embodiment of a component according to the disclosure with a layer system comprising an intermediate layer on a substrate in a schematic representation.
Figure 3B:
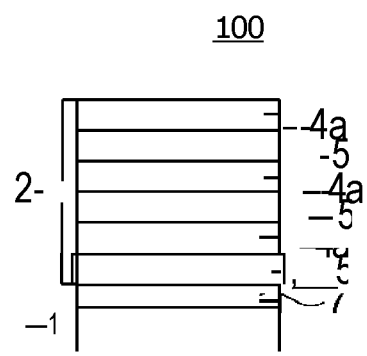
FIG. 3B shows an exemplary embodiment of a component according to the disclosure with a layer system comprising an intermediate layer on a substrate in a schematic representation.
Figure 4A:
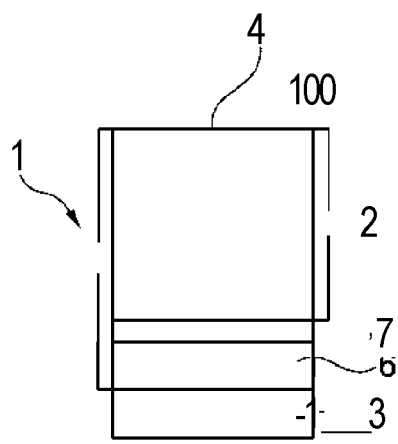
FIG. 4A shows an exemplary embodiment of a component according to the disclosure with a layer system comprising an adhesive layer and an intermediate layer on a substrate in a schematic representation.
Figure 4B:
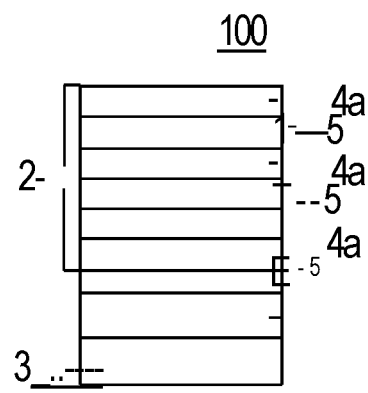
FIG. 4B shows an exemplary embodiment of a component according to the disclosure with a layer system comprising an adhesive layer and an intermediate layer on a substrate in a schematic representation.

The layer systems 1 shown here and in FIGS. 2B, 3B and 4B are exemplary representations. The sequence of doped first sub-layers 4a and undoped second sub-layers 5 can in principle contain any number of first sub-layers 4a and second sub-layers 5.

In the exemplary embodiment of a component 100 shown in FIG. 2A, an adhesive layer 6 is arranged between the substrate 3 and the protective layer 2, which improves the binding of the protective layer 2 to the substrate 3 and, together with the protective layer 2, forms the layer system 1.

In the exemplary embodiment of a component 100 shown in FIG. 2B, there is an adhesive layer 6 arranged between the protective layer 2, which comprises an alternating sequence of first sub-layers 4a made of a doped tetrahedral amorphous carbon and of second sub-layers 5 made of an undoped tetrahedral amorphous carbon, and the substrate 3.

In the exemplary embodiment of a component 100 shown in FIG. 3A, an intermediate layer 7, which together with the protective layer 2 forms the layer system 1, is arranged between a substrate 3 and the protective layer 2 comprising only a first sub-layer 4a made of doped tetrahedral amorphous carbon.

In the exemplary embodiment of a component 100 shown in FIG. 3B, an intermediate layer 7 is arranged between a protective layer 2, which has an alternating sequence of first sub-layers 4a made of a doped tetrahedral amorphous carbon and of second sub-layers 5 made of an undoped tetrahedral amorphous carbon, and together with the first sub-layers 4a and the second sub-layers 5 forms the layer system 1 applied to the substrate 3.

In the exemplary embodiment of a component 100 shown in FIG. 4A, an adhesive layer 6 and an intermediate layer 7 are arranged between the substrate 3 and the protective layer 2 in the form of a first sub-layer 4 made of doped tetrahedral amorphous carbon, and together with the protective layer 2 form the layer system 1. The adhesive layer 6 improves the binding of the intermediate layer 7 to the substrate 3, while the intermediate layer 7 in turn functions as an adhesion promoter between the adhesive layer 6 and the protective layer 2. During the manufacturing process, the intermediate layer 7 can either be deposited separately after the adhesive layer 6 and before the protective layer 2 or, for example, can be formed by a reaction between the adhesive layer 6 and the protective layer 2 or by an implantation of carbon into the adhesive layer 6.

In the exemplary embodiment of a component 100 shown in FIG. 4B, an adhesive layer 6 and an intermediate layer are arranged between the protective layer 2, which has an alternating sequence of first sub-layers 4a made of a doped tetrahedral amorphous carbon and of second sub-layers 5 made of an undoped tetrahedral amorphous carbon 7, and, similarly to FIG. 4A, improve the binding to the substrate 3.

Figure 5:
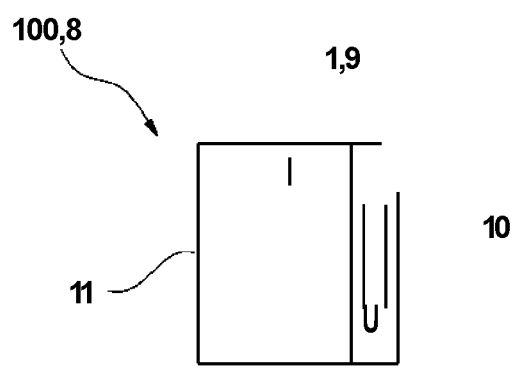
FIG. 5 shows an exemplary embodiment of a component according to the disclosure in the form of a rolling element in a schematic representation.

When the component 100 shown in FIG. 5 is in the form of a rolling element 8, the running surface 9 of the rolling element 8 is provided with a layer system 1 to utilize the friction-reducing and wear-reducing properties of the protective layer 2 for use of the rolling element 8 as part of a valve control of an internal combustion engine. Optionally, the side surfaces 10, 11 of the rolling element 8 can also be provided with the layer system 1.

The rolling element 8 described above is in particular a cam roller 8, wherein an embodiment of the layer system 1 is formed on the running surface 9 of the rolling element 8 and/or on one or more side surfaces 10, 11 of the rolling element 8.

The components 100 described above and the rolling element 8 described above can be produced with an embodiment of the method according to the disclosure, in which a protective layer 2 comprising at least one first sub-layer 4a of doped tetrahedral amorphous carbon is applied to a substrate 3 or the running surface 9 and/or the side surfaces 10, 11, wherein the protective layer 2 is applied by physical vapor deposition by means of arc evaporation and/or high-power impulse magnetron sputtering, wherein at least one dopant is introduced into the at least one first sub-layer 4a via a gas phase and/or a target made of doped carbon is used and/or the at least one dopant is introduced into the at least one first sub-layer 4a by co-sputtering.

LIST OF REFERENCE SIGNS

1 Layer system
2 Protective layer
3 Substrate
4, 4a First sub-layer made of doped tetrahedral amorphous carbon
5 Second sub-layer made of undoped tetrahedral amorphous carbon
6 Adhesive layer
7 Intermediate layer
8 Rolling element
9 Running surface
10 First side surface
11 Second side surface
100 Component

The invention claimed is:

1. A component, comprising:
a substrate;
a layer system applied at least in parts to the substrate;
wherein the layer system comprises a friction-reducing and wear-reducing protective layer that forms a component surface, the protective layer has a hardness which is greater than 40 GPa, the protective layer further has a first sub-layer made of:
doped tetrahedral amorphous carbon which comprises $sp^3$-hybridized carbon having a mole fraction of greater than 50%,
oxygen in a concentration in a range from 0.1 at % to 3.0 at %,
hydrogen in a concentration in a range from 0.1 at % to 15 at %, and
one or more of the following dopants in a concentration in a range from 0.03 at % to 15 at %:
chromium, molybdenum, tungsten, silicon, copper, niobium, zirconium, vanadium, nickel, iron, silver, hafnium, fluorine, boron or nitrogen.

2. The component according to claim 1, wherein the layer system has an adhesive layer arranged between the substrate and the protective layer, and the adhesive layer has chromium, titanium, tungsten, zirconium, molybdenum, chromium nitride, titanium nitride, tungsten nitride, molybdenum nitride, or zirconium nitride.

3. The component according to claim 2, wherein the adhesive layer has a layer thickness in a range from 0.001 µm to 2.0 µm.

4. The component according to claim 2, wherein the layer system has an intermediate layer arranged between the adhesive layer and the protective layer, and the intermediate layer has at least one of a carbide, carbonitride of a metal or transition metal, or a non-metal.

5. The component according to claim 4, wherein the intermediate layer has a layer thickness in a range from 0.001 µm to 1.0 µm.

6. The component according to claim 1, wherein the protective layer has one or more of the first sub-layers made of the doped tetrahedral amorphous carbon and further includes one or more second sub-layers made of undoped tetrahedral amorphous carbon, and the first and the second sub-layers alternate with one another.

7. The component according to claim 1, wherein the component is a sliding bearing component or a roller bearing component or a component of a finger follower or a rocker arm or a pump tappet or a roller tappet.

8. The component according to claim 7, wherein the layer system is arranged in at least one of a rolling contact, an anti-friction contact, or a sliding contact to an adjacent contact component.

9. A method for producing a component according to claim 1, the method comprising applying the first sub-layer made of the doped tetrahedral amorphous carbon by physical vapor deposition using arc evaporation, and introducing the at least one dopant into the first sub-layer via at least one of a gas phase, a target made of doped carbon, or co-sputtering into the first sub-layer.

10. A valve train system component, comprising:
a substrate;
a layer system applied at least in parts to the substrate;
wherein the layer system comprises a friction-reducing and wear-reducing protective layer that forms a component surface, the protective layer has a first sub-layer made of:
doped tetrahedral amorphous carbon which comprises $sp^3$-hybridized carbon having a mole fraction of greater than 50%,
oxygen in a concentration in a range from 0.1 at % to 3.0 at %,
hydrogen in a concentration in a range from 0.1 at % to 15 at %, and
one or more of the following dopants in a concentration in a range from 0.03 at % to 15 at %:
chromium, molybdenum, tungsten, silicon, copper, niobium, zirconium, vanadium, nickel, iron, silver, hafnium, fluorine, boron or nitrogen; and
wherein the layer system has an adhesive layer arranged between the substrate and the protective layer, and an intermediate layer arranged between the adhesive layer and the protective layer, the intermediate layer being at least one of a carbide, carbonitride of a metal or transition metal, or a non-metal.

11. The valve train system component according to claim 10, wherein the adhesive layer has at least one of chromium, titanium, tungsten, zirconium, molybdenum, chromium nitride, titanium nitride, tungsten nitride, molybdenum nitride, or zirconium nitride.

12. The valve train system component according to claim 11, wherein the adhesive layer has a layer thickness in a range from 0.001 µm to 2.0 µm.

13. The valve train system component according to claim 10, wherein the intermediate layer has a layer thickness in a range from 0.001 µm to 1.0 µm.

14. The valve train system component according to claim 10, wherein the protective layer has one or more of the first sub-layers made of the doped tetrahedral amorphous carbon and further includes one or more second sub-layers made of undoped tetrahedral amorphous carbon, and the first and the second sub-layers alternate with one another.

15. The valve train system component according to claim 10, wherein the protective layer has a hardness which is greater than 40 GPa.

16. A method for producing a component according to claim 1, the method comprising applying the first sub-layer made of the doped tetrahedral amorphous carbon by physical vapor deposition using high-power impulse magnetron sputtering, and introducing the at least one dopant into the first sub-layer via at least one of a gas phase, a target made of doped carbon, or co-sputtering into the first sub-layer.

* * * * *